United States Patent [19]

Gillery

[11] 4,336,119
[45] Jun. 22, 1982

[54] METHOD OF AND APPARATUS FOR CONTROL OF REACTIVE SPUTTERING DEPOSITION

[75] Inventor: F. Howard Gillery, Allison Park, Pa.

[73] Assignee: PPG Industries, Inc., Pittsburgh, Pa.

[21] Appl. No.: 229,378

[22] Filed: Jan. 29, 1981

[51] Int. Cl.$^3$ ............................................. C23C 15/00
[52] U.S. Cl. .......................... 204/192 P; 204/192 R; 204/298
[58] Field of Search ......... 204/192 R, 192 P, 192 SP, 204/192 D, 298

[56] References Cited

U.S. PATENT DOCUMENTS

| | | | |
|---|---|---|---|
| 3,698,946 | 10/1972 | Kaspaul et al. | 428/432 |
| 3,878,085 | 4/1975 | Corbani | 204/298 |
| 3,907,660 | 9/1975 | Gillery | 204/298 |
| 3,956,093 | 5/1976 | McLeod | 204/192 |
| 3,962,488 | 6/1976 | Gillery | 427/109 |
| 4,024,291 | 5/1977 | Wilmanns | 427/10 |
| 4,027,192 | 5/1977 | Hanak | 313/498 |
| 4,043,889 | 8/1977 | Kochel | 204/192 R |
| 4,094,763 | 6/1978 | Gillery et al. | 204/192 P |
| 4,102,768 | 7/1978 | Kearin et al. | 204/192 P |
| 4,111,775 | 9/1978 | Hollis et al. | 204/192 C |
| 4,113,599 | 9/1978 | Gillery | 204/192 P |
| 4,116,806 | 9/1978 | Love et al. | 204/298 |
| 4,124,474 | 11/1978 | Bomchil et al. | 204/192 R |
| 4,141,621 | 2/1979 | Aagard et al. | 350/96.12 |
| 4,166,783 | 9/1979 | Turner | 204/192 R |
| 4,166,784 | 9/1979 | Chapin et al. | 204/192 R |
| 4,172,020 | 10/1979 | Tisone et al. | 204/192 R |
| 4,194,022 | 3/1980 | Gillery | 427/109 |
| 4,201,645 | 5/1980 | Riegert | 204/192 R |
| 4,283,260 | 8/1981 | Thomas | 204/192 R |

FOREIGN PATENT DOCUMENTS 2232832 2/1975 France ........................... 204/192 R

OTHER PUBLICATIONS

J. C. C. Fan et al., "Transparent Heat-Mirror Films of TiO$_2$/Ag/TiO$_2$ For Solar Energy Collection & Radiation Insulation," *Appl. Phys. Lett.*, vol. 25, pp. 693-695, (1974).

C. W. Pitt et al., "Automatic Monitoring of Deposition Conditions During RF Sputtering of Dielectric Materials," *Vacuum*, vol. 25, pp. 265-271, (1975).

Buchanan, Webb and Williams: Preparation of Conducting and Transparent Thin Films of Tin-Doped Indium Oxide by Magnetron Sputtering: (Jul. 15, 1980), *Applied Phys. Lett.* vol. 37, No. 2, pp. 213-215.

Schiller, Heisig, Steinfelder and Stumpfel; Reactive D.C. Sputtering with the Magnetron-Plasmetron for Tantalum Pentoxide and Titanium Dioxide Films; *Thin Solid Films* (1979), pp. 369-375.

Howson, Avaritsiatis, Ridge and Bishop; Formation of Transparent Heat Mirror by Ion Plating onto Ambient Temperature Substrates; *Thin Solid Films*, (1979), pp. 163-167.

Howson and Ridge; Deposition of Transparent Heat Reflecting Coatings of Metal Oxides Using Reactive Planar Magnetron Sputtering of Metal/Alloy, 1980.

*Primary Examiner*—Aaron Weisstuch
*Attorney, Agent, or Firm*—Donna L. Seidel; Lee Patch

[57] ABSTRACT

A method and apparatus for the control of reactive sputtering deposition of oxide-containing films, including the monitoring of and maintaining the constancy of the deposition rate and total pressure of the system by adjustment of the oxygen and argon input flow rates. Deposition rate is monitored by an activated quartz crystal, and behaves as a sensitive function of actual oxygen partial pressure. Stoichiometry, optical and electrical properties of the oxide-containing films are therefore controllable by maintaining constant oxygen partial pressure.

16 Claims, 5 Drawing Figures

METHOD OF AND APPARATUS FOR CONTROL OF REACTIVE SPUTTERING DEPOSITION

BACKGROUND OF THE INVENTION

1. Field of the Invention

The present invention relates to a method of controlling reactive sputtering deposition of transparent metal oxide films on substrates, and further, to the formation of reproducible uniform films of indium oxide or titanium oxide.

2. Discussion of the Technical Problem

Methods are known in the art of thin films for producing a titanium oxide-based transparent electroconductive coating. For example, U.S. Pat. No. 3,698,946 to Kaspaul et al. discloses coatings comprising a first layer of titanium monoxide, a second layer of copper, silver, gold, platinum, or tin, and a third layer of titanium monoxide. The coated articles are useful as photodetectors, light emitting devices, image converters and image amplifiers. While the coated articles are described as transparent and electrically conductive, the transmittances of 38 to 76 percent and resistances of 1600 to 200,000 ohms per square are unsuitable for certain applications such as motor vehicle windows which require a high transmittance, preferably 80 percent or higher, and very low resistance, preferably less than 10 ohms per square, to develop useful amounts of heat with available generator voltages. In addition, the titanium monoxide imparts a distinct color to transmitted light.

U.S. Pat. No. 3,962,488 to Gillery teaches a method for making a colorless, highly transparent coating which also has excellent conductivity, the resistance being less than 10 ohms per square. Gillery discloses that the substitution of titanium dioxide for the monoxide of Kaspaul eliminates the color and transparency problems. However, direct deposition of titanium dioxide is incompatible with the intermediate conductive layer. An intermediate silver film, for example, which is initially continuous and highly conductive becomes discontinuous, resulting in a marked increase in resistance and decrease in transmittance in less than 24 hours. Gillery's invention involves depositing the titanium oxide layers as $TiO_x$ wherein x is greater than 1.3 but less than 1.7. While the coating may initially be somewhat colored, it becomes colorless as the titanium suboxide is oxidized upon exposure to a normal atmosphere of air or when subjected to the conditions of lamination.

U.S. Pat. No. 4,194,022 to Gillery teaches a method of controlling the rate of oxidation of a film of titanium suboxide in the above-described coating by treating the coating with a vapor of an oil, wax, heavy organic alcohol, or amine prior to exposure to an oxidizing atmosphere. Such a method was preferred because uncontrolled oxidation of the titanium suboxide film may jeopardize the continuity of the adjacent electroconductive film.

While useful in producing desirable electroconductive coatings by evaporation techniques, the previously discussed techniques have limitations associated therewith which would preferably be avoided. For example, the techniques required both a deposition step and a subsequent oxidation step. Further, the treatment of the coating with an oxidation-retarding medium may prove to be inconvenient. Thus, previously utilized techniques for making a titanium oxide-based transparent electroconductive coating resulted in either undesirable optical and electrical properties, or involved inconvenient procedures. It would be desirable to eliminate such difficulties.

Methods are also known for producing a transparent, electroconductive indium oxide film. However, indium oxide films having low resistance and high luminous transmittance were previously obtainable only by deposition onto hot substrates or by deposition with subsequent heat treatment. It would be desirable to have a method of depositing a transparent electroconductive indium oxide film which could be used with both ambient temperature substrates and elevated temperature substrates.

Further, considerable difficulty has been encountered in the reactive sputtering deposition art in controlling the stoichiometry, optical characteristics, and electrical properties of deposited oxide-containing films. One source of such difficulty is the varying amounts of outgassing which occur during the sputtering process, leading to uncertainty in the composition of the sputtering atmosphere. As a result, coating uniformity and reproducibility has been less than ideal.

U.S. Pat. No. 4,113,599 to Gillery teaches a sputtering technique for the reactive deposition of indium oxide in which the flow rate of oxygen is adjusted to maintain a constant discharge current while the flow rate of argon is adjusted to maintain a constant pressure in the sputtering environment. While successful in controlling reactive deposition by conventional D.C. or R.F. processes where the substrate temperature, gas partial pressures, and gas flow rates are relatively high with respect to outgassing contributions, such technique does not provide the preferred degree of control when utilized in reactive magnetically enhanced sputtering, where the gas partial pressures and gas flow rates are preferably relatively low. In such an environment outgassing contributions may be proportionally more significant, thus requiring more precise control over chamber conditions. It would be desirable to have a method of controlling reactive sputtering deposition which is sufficiently precise to be utilizable in magnetically enhanced sputtering techniques as well as in conventional D.C. and R.F. sputtering techniques.

SUMMARY OF THE INVENTION

The present invention provides a method of and apparatus for controlling the deposition of an oxide-containing film formed by reactive sputtering. An evacuated atmosphere of partial pressures of oxygen and a chemically inert gas is established in a coating chamber having a preselected total pressure less than about $10^{-1}$ torr. A predetermined level of electrical power is applied to a cathode within the coating chamber to initiate sputtering of a selected material from the cathode surface toward a substrate. While sputtering proceeds, the deposition rate of the oxide-containing film being formed on the substrate is monitored to indicate oxygen partial pressure in the chamber, while the gas pressure within the coating chamber is also monitored. In response to the monitored deposition rate and gas pressure, the input rates of the oxygen and chemically inert gas are adjusted to maintain a constant deposition rate and gas pressure in the coating chamber.

The oxygen partial pressure in the chamber determines the stoichiometry, optical and electrical properties of the reactively deposited film. Therefore, production of desirable oxide-containing films requires precise control of oxygen partial pressure, which has heretofore been largely unattainable. According to the present invention, oxygen partial pressure can be controlled during the deposition process by monitoring the deposition rate, which is a sensitive function of oxygen partial pressure. Constant oxygen partial pressure can be maintained during deposition by monitoring the deposition rate and adjusting the oxygen input rate to maintain the deposition rate constant. Therefore, desirable oxide-containing coatings which are substantially uniform throughout their thickness may be produced by maintaining a constant predetermined cathode power, chamber pressure, and deposition rate during the deposition process.

The present invention also provides a method of making a transparent electroconductive coating, which method includes the steps of magnetically enhanced sputtering a first substantially transparent film of titanium oxide onto a substrate; depositing a substantially transparent electroconductive film of a selected metallic material onto the first titanium oxide film; and magnetically sputtering a second substantially transparent film of titanium oxide onto the electroconductive film. The magnetically enhanced sputtering is conducted in an evacuated atmosphere having a controlled partial pressure of oxygen to provide the first titanium oxide film with an optical extinction coefficient between about 0.03 and 0.3 when deposited and the second titanium oxide film with an optical extinction coefficient less than about 0.3. Unlike the previously discussed techniques, the method of the present invention provides for the deposition of ideally oxidized titanium oxide films which are substantially transparent upon deposit, require no subsequent oxidation or oxidation retarding treatment, and which promote stability of the electroconductive film conductivity. The term "titanium oxide" is used generically herein to mean a composition of titanium and oxygen, irrespective of relative proportions thereof.

The present invention further relates to a method of depositing a transparent, electroconductive indium oxide film on substrates at ambient temperature as well as at elevated temperatures. The present invention includes the steps of establishing an evacuated atmosphere of about 50% to 90% argon and about 50% to 10% oxygen at a total pressure between about $2 \times 10^{-4}$ torr and $20 \times 10^{-4}$ torr; magnetically enhanced sputtering of indium or an indium-tin alloy from a cathode at a predetermined cathode power; monitoring the deposition rate of the indium oxide film being formed on a substrate and the total gas pressure; and inputting oxygen and/or argon into the chamber in response to the monitored deposition rate and total pressure to maintain a constant deposition rate and total pressure.

DETAILED DESCRIPTION OF THE INVENTION

Figure 1:
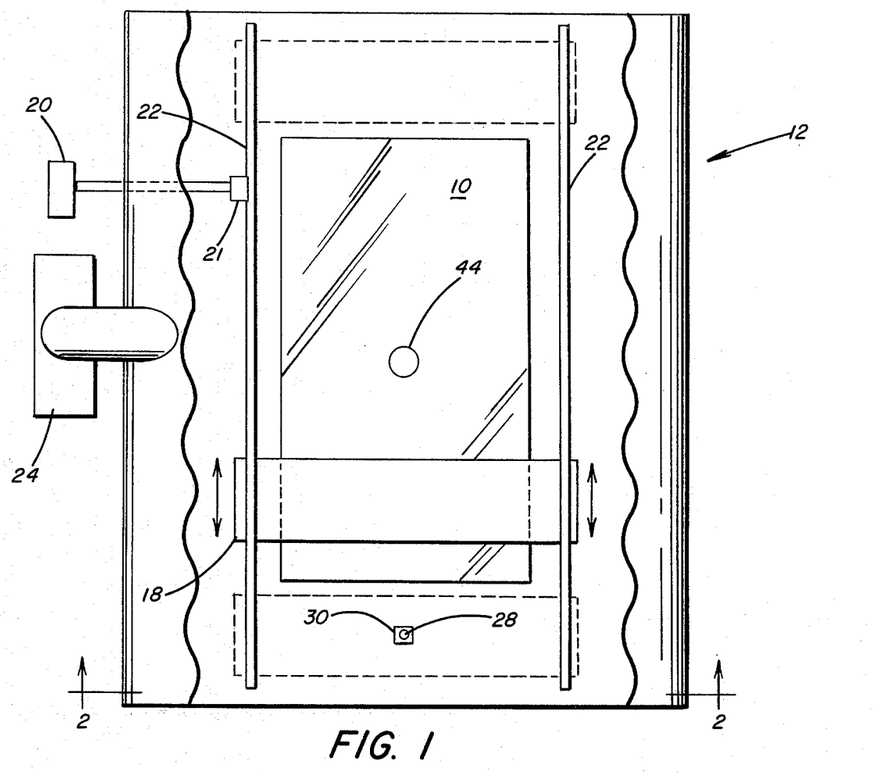
FIG. 1 is a plan view in partially schematic form of the interior of a coating chamber incorporating features of the invention having portions removed for purposes of clarity.
Figure 2:
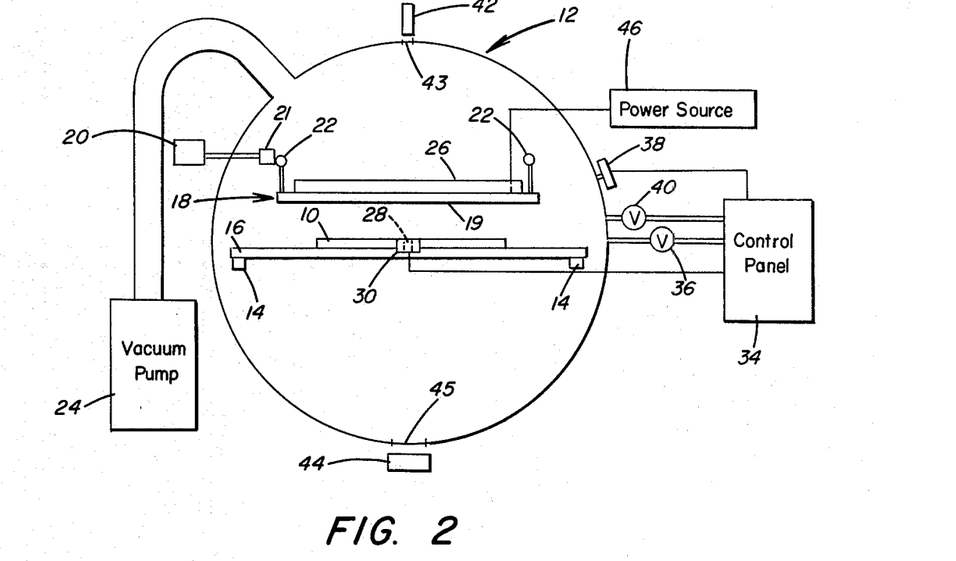
FIG. 2 is a sectional view taken along line 2—2 of FIG. 1, additionally schematically illustrating a deposition control system according to the present invention.

Referring to FIGS. 1 and 2, a substrate 10 is supported within a coating chamber 12 in any convenient manner, e.g., by support rails 14 and sheet 16 (shown only in FIGS. 2 and 3), in face-to-face relation with a cathode 18 having a target surface 19. During operation, the surface of the substrate 10 and the target surface 19 of cathode 18 are preferably spaced about $3\frac{1}{2}$ inches (8.8 cm) apart. As indicated by the arrows, although not limiting to the invention, the cathode 18 is preferably a scanning cathode which is controllably traversed by motor 20 and drive shaft assembly 21 along a reciprocating path upon support tracks 22 so as to completely cover and extend beyond the surface area of the substrate 10, as shown in phantom in FIG. 1.

The coating chamber 12 may be of the type disclosed in U.S. Pat. No. 4,094,763, which teachings are herein incorporated by reference, or it may be of the type available from the High Vacuum Engineering Equipment Corp. of Hingham, Mass. or from the Stokes Division of Pennwalt Corporation of Philadelphia, Pa. A vacuum pump 24 communicates with the interior of chamber 12 to controllably draw a vacuum therein.

The substrate 10 which may be used in the practice of this invention includes glass, ceramics, rigid plastics, and certain flexible plastics. Organic materials which may be used include polyesters, cast and stretched acrylics, polycarbonates, chlorinated plastics, epoxies, and other convenient materials which are compatible with expected temperatures within the chamber 12 during deposition.

The cathode 18 may be of the type generally known in the vacuum sputtering art, and in preferred embodiments of the invention includes a magnetic element 26 (shown only in FIGS. 2 and 3) adjacent its target surface 19 to promote magnetically enhanced sputtering. The cathode target surface should be faced with an appropriate oxide-forming material, the choice depending upon the desired final product. Preferred materials in the practice of the present invention include indium, indium-tin alloys, titanium, zirconium, chromium, and vanadium.

With continued reference to FIGS. 1 and 2, a deposition rate monitor 28 may be mounted within the chamber 12 within the area swept out by the cathode 18 adjacent to but spaced from the peripheral edge of the substrate 10, preferably in the same plane as substrate 10. The deposition rate monitor 28 is mounted in a housing 30 which provides both fluid cooling and magnetic shielding from excess electron bombardment to protect it from undesirable heating which could cause premature failure. In this configuration the stationary deposition rate monitor 28 is used for cyclic measurement of the deposition rate and is preferably activated each time the cathode 18 is centrally positioned thereover during its reciprocating movement.

Figure 3:
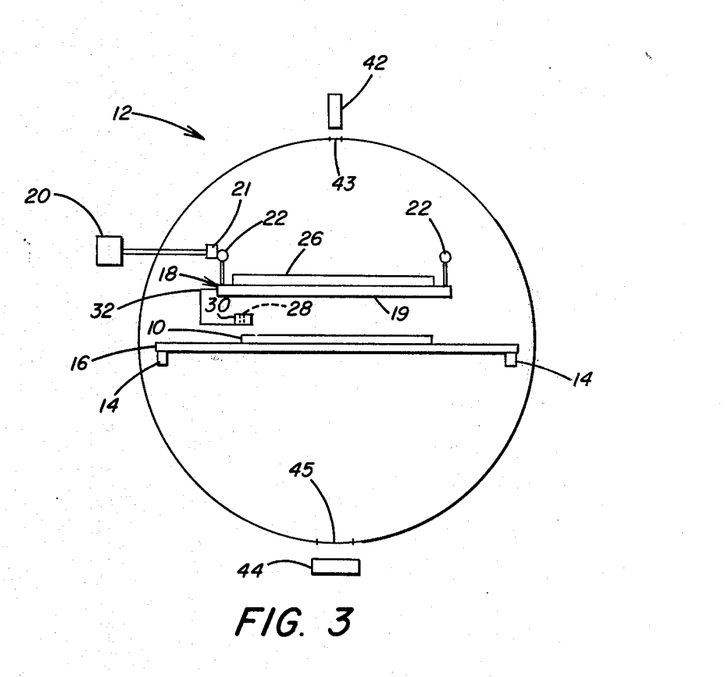
FIG. 3 is a view similar to FIG. 2 illustrating an alternate embodiment of a deposition control system according to the present invention, having portions removed for purposes of clarity.

With reference to FIG. 3, there is shown an embodiment of the apparatus of the present invention wherein the deposition rate monitor 28 and housing 30 are mounted to the cahode 18 by bracket 32 for continuous movement therewith. In this embodiment of the invention the deposition rate monitor 28 may be continuously activated to continuously measure the deposition rate as the cathode 18 scans over the substrate 10.

The deposition rate monitor 28 utilized in the practice of the present invention is preferably a quartz crystal monitor such as those commercially available from Inficon Leybold Heraeus, Corp. of East Syracuse, N.Y., Model XMS-3. When electrically activated, such a crystal vibrates at a certain frequency which is dependent upon the mass of material which is deposited thereon. A measurement of the change in frequency of vibration in an increment of time yields a reliable value representing the deposition rate upon the crystal. Routing of electrical cables to the deposition rate monitor 28 should be carefully arranged so as to avoid spurious signals.

The deposition rate monitor 28 is electrically connected to an electrical control panel 34 (shown only in FIG. 2) which amplifies the signal therefrom, displays a numerical value corresponding to the deposition rate, and preferably acts on an oxygen input valve 36 in response thereto, as will be described more fully hereinafter. Oxygen input valves 36 which may be used in the present invention include piezoelectric gas leak valves such as those commercially available from Veeco Instruments, Inc. as Model PV-10.

An ionization gauge 38 is also mounted adjacent to and communicates with the interior of chamber 12 for monitoring the total gaseous pressure therein. The ionization gauge 38 provides a signal to the control panel 34, which displays a numerical value for the pressure in chamber 12 and acts on an argon input valve 40 in response thereto. The ionization gauge 38 and argon input valve 40 may be of the type sold by the Granville Phillips Company of Boulder, Colo. as Series 216.

With reference to FIG. 2, a source of light 42, e.g., a modulated beam photometer 42, is mounted outside the chamber 12 to project a monochromatic beam of light (e.g. 550 nm) through a transparent port 43 toward the substrate 10. A photoelectric cell 44 (also shown in FIG. 1) is conveniently positioned adjacent a transparent port 45 beneath the substrate 10 in a position to determine the intensity of the beam of light and thereby measure the luminous transmittance of the substrate 10 as deposition progresses. Alternatively, and for particular use with a nontransparent substrate 10, luminous transmittance of the deposited film may be measured by positioning the photoelectric cell 44 to receive light from the light source 42 which is reflected by the film. Preferred transmittance measuring equipment was obtained from Edwards of London, England.

With continued reference to FIG. 2, a power source 46 is provided for electrical connection with the cathode 18. The power source 46 may be a D.C. power source such as those commercially available from Vactec Systems, Inc. of Boulder, Colo., or it may be an R.F. power source such as those commercially available from Varian Corp. of Palo Alto, Calif.

In operation, reactive sputtering is conducted according to the present invention by positioning a substrate 10 within the chamber 12 upon sheet 16 and thereafter evacuating the chamber 12 with vacuum pump 24 to a preselected pressure less than about $10^{-1}$ torr, preferably less than about $10^{-4}$ torr, and most preferably less than about $3 \times 10^{-5}$ torr. A predetermined evacuated atmosphere of partial pressures of oxygen and a chemically inert gas, preferably argon, is then established within the chamber 12, the composition and total pressure of which is dependent upon the type of sputtering to be conducted and the final product sought. Generally, magnetically enhanced sputtering may be conducted at lower total pressures than D.C. or R.F. sputtering.

With reference to the stationary deposition rate monitor 28 of FIGS. 1 and 2, the cathode 18 is initially centrally positioned over the deposition rate monitor 28, afterwhich the cathode 18 is energized with a predetermined electrical power and the deposition rate monitor 28 is electrically activated to measure the initial deposition rate at the position below the cathode center. Any variance between the initial deposition rate and a predetermined preferred deposition rate is eliminated by a signal from the control panel 34 which causes an adjustment of the oxygen input rate at the oxygen input valve 36. Generally, an increase in oxygen input rate decreases the deposition rate and a decrease of oxygen input rate increases the deposition rate. Total chamber pressure is maintained constant by signals from the control panel 34 to the argon input valve 40, in response to signals received from the ionization gauge 38. The predetermined cathode power, preferred deposition rate, and total chamber pressure are each selected to achieve the desired degree of oxidation in the oxide-containing film to be deposited upon the substrate 10.

After the gaseous input rates have been adjusted to attain the desired operating conditions, the cathode 18 is scanned over the surface of the substrate 10 to deposit a thin film thereon, afterwhich it returns to its initial position over the deposition rate monitor 28. Necessary adjustments are made in oxygen and argon input rates to maintain the desired operating conditions, and scanning is recommenced. This procedure is continued until an oxide-containing film having the desired thickness, electrical properties, and optical properties is attained.

With reference to FIG. 3, the movably mounted deposition rate monitor 28 may be used to transmit continuous signals to the control panel 34 (shown only in FIG. 2), which in turn responds to the continuously received signals from the ionization gauge 38 and deposition rate monitor 28 with appropriate adjustments of the oxygen and argon input rates at oxygen input valve 36 and argon input valve 40, thereby continuously maintaining the desired deposition conditions.

Of course it will be appreciated that the present invention is not limited to the above-described preferred apparatus and control techniques, as successful deposition can also be achieved by manual adjustment of the oxygen and argon input rates in response to the signals received from the deposition rate monitor 28 and ionization gauge 38, respectively. Further, it will be appreciated that continuous and automatic deposition control can be achieved by holding the cathode 18 and the deposition rate monitor 28 stationary while conveying the substrate 10 with respect thereto.

Figure 4:
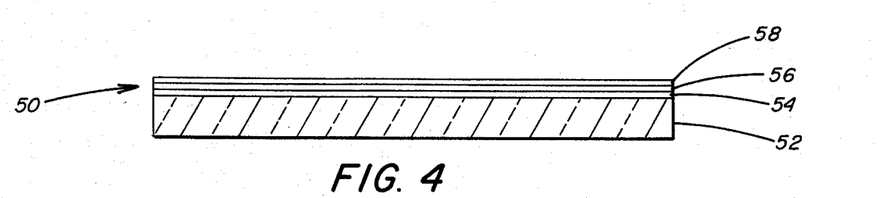
FIG. 4 is a sectional side view of a transparent electroconductive article according to the present invention.

Referring to FIG. 4, a transparent electroconductive article 50 produced in accordance with the present invention is shown, consisting of a substrate 52, an inner layer 54 of titanium oxide, an intermediate electroconductive layer 56, and an outer layer 58 of titanium oxide.

The substrate 52 may be selected from a variety of materials, the choice being governed by the end use desired and the compatability of the substrate 52 and the inner layer 54. Preferred substrates are nonstretchable under normal use to avoid damaging the layers 54, 56, and 58, and also do not contain excessive amounts of volatile materials such as plasticizers, water vapor, or absorbed gases. Suitable candidates include glass, ceramics, rigid plastics, and certain flexible plastics such as polyesters, cast acrylics, polycarbonates, chlorinated plastics, and epoxies.

The inner layer 54 of titanium oxide, deposited in a manner to be discussed below, has a particular combination of properties which are desirable in an article produced in accordance with the practice of the present invention. First, the inner layer 54 adheres extremely well to glass and relatively well to plastics, thus contributing to a durable end product. Second, the inner layer 54 deposited according to the teachings of the present invention promotes the stable formation of a continuous thin film of the selected metallic material, e.g., silver or gold, used in the intermediate electroconductive layer 56. More normally, thin silver or gold films are found in discontinuous, globular form. Third, the inner layer 54 has a high refractive index which enables it to reflect sufficient energy out of phase with the intermediate layer 56 to produce an antireflective effect, and therefore, a highly transmitting combination.

The degree of oxidation of the titanium oxide of the inner layer 54 has been found to be closely related to the electroconductive and luminous transmittance characteristics of the final product, i.e., article 50. If the titanium oxide of inner layer 54 is too highly oxidized, the electroconductivity of the intermediate layer 56 may be made unstable, resulting in immediate high resistances, or in marked increases in resistance with time. If the titanium oxide of inner layer 54 is not sufficiently oxidized, the luminous transmittance of the layer 54 is adversely affected.

Prior to the present invention, it was customary to attain a desired degree of oxidation in titanium oxide films by an evaporation technique carried out in two distinct stages; first, by depositing titanium oxide in an under-oxidized state and thereafter, by introducing an oxidizing atmosphere thereto to attain the desired degree of oxidation.

It has been found according to the present invention that the titanium oxide of inner layer 54 can be successfully magnetically enhanced sputtered onto the substrate 52 with the degree of oxidation desired, thus eliminating the need for further oxidation. Further, and contrary to previous understanding in the art, such ideally oxidized titanium oxide films are fully compatible with subsequently deposited metallic thin films. Deposition of ideally oxidized titanium oxide films is also more easily controlled in the practice of the present invention than heretofore, yielding a more consistent final product.

It is believed that the preferred titanium oxide films deposited according to the present invention comprise a combination of titanium dioxide intermixed with atoms and/or small agglomerations of titanium metal, i.e., films of titanium oxide having greater than 1.7 but less than 2.0 parts oxygen to parts titanium, and preferably between 1.9 and 2.0. Such films may be characterized as having an optical extinction coefficient between about 0.03 and 0.3, preferably between 0.03 and 0.09, and most preferably between 0.06 and 0.08. Inner layer 54 is preferably deposited with a thickness within the range of about 200 to 500 Ångstroms to obtain the desired optical properties and film continuity. The inner layer 54 should be of a specific thickness so as to cooperate interferometrically with the intermediate layer 56 to give high luminous transmittance.

The inner layer 54 is preferably deposited according to the present invention by magnetically sputtering a titanium metal cathode in an evacuated atmosphere having partial pressures of oxygen and argon. Initially, the coating chamber 12 is evacuated to less than $3 \times 10^{-5}$ torr, after which an atmosphere of about 75% argon and 25% oxygen at a total pressure of about $6 \times 10^{-4}$ torr is established. The cathode 18 is activated at a preselected constant electrical power, and the deposition rate and total chamber pressure are established at preselected values as hereinbefore described.

Upon reaching the desired coating conditions, the cathode 18 is scanned across the surface of the substrate 52 at a preselected rate to deposit a thin layer of an ideally oxided film thereon. The luminous transmittance of the substrate 52 is monitored during deposition by the photometer 42 and photoelectric cell 44 and decreases as the thickness of the film increases, from an initial value of about 90% for a glass substrate 52. Deposition rate, and therefore the degree of oxidation of the deposited titanium oxide film, is maintained constant either cyclically, utilizing the apparatus of FIGS. 1 and 2, or continuously, utilizing the embodiment of the invention illustrated in FIG. 3. Deposition of the inner layer 54 is preferably terminated when the luminous transmittance decreases to a value between about 72% and 76%, (about 80% to 85% of the transmittance of the uncoated substrate) a condition which is usually reached with a film thickness between about 300 Å and 350 Å, entailing about 5 to 7 passes of the cathode 18 over the substrate 52. Generally during the above-described procedure, the oxygen input rate is gradually increased to compensate for decreasing amounts of outgassing from the coating chamber 12. The inner layer 54 preferably has an optical extinction coefficient between about 0.06 and 0.08 upon deposit, according to the present invention.

The intermediate layer 56 of the article 50 comprises a substantially transparent, electroconductive layer of a metallic material. Metallic materials suitable for use in intermediate layer 56 includes those which form thin films having surface resistances of less than about 30 ohms per square while maintaining a transmittance, when ideally antireflected by surrounding dielectric layers, of greater than about 60%. Preferred metallic materials form films having surface resistances of less than about 10 ohms per square, and exhibit transmittance greater than about 95% when ideally antireflected. Known materials exhibiting such properties include silver, gold, copper, tin, aluminum, magnesium or platinum. Silver or gold are preferred materials for the formation of high conductivity films having thicknesses sufficiently small to retain high luminous transmittance. Such high conductivity films should be continuous, even slight discontinuities producing drastic decreases in electrical conductivity and luminous transmittance. Preferably, the intermediate layer 56 has a thickness between about 60 Ångstroms and 250 Ångstroms for gold, and between about 100 Ångstroms and 250 Ångstroms for silver. Thicknesses significantly greater than 250 Ångstroms may adversely affect the luminous transmittance of intermediate layer 56. The intermediate layer 56 may be deposited upon the inner layer 54 in any convenient manner, e.g., by D.C. sputtering, by R.F. sputtering, by vacuum evaporation, or by magnetically enhanced sputtering. Preferably, the intermediate layer 56 is deposited by magnetically enhanced sputtering in the same chamber in which the inner layer 54 and outer layer 58 are deposited.

Such deposition is preferably accomplished at a high rate and at a low substrate temperature, e.g., 94 Å/sec at 25° C., in order to promote the desired thin continuous film. Luminous transmittance of the substrate 52 is monitored during such deposition and the deposition is preferably terminated when luminous transmittance has decreased to between about 66% and 62%, (an additional decrease of between about 10% and 12% of the original luminous transmittance of the uncoated substrate 52) preferably resulting in films having electrical resistivity of less than about 10 ohms per square.

The outer layer 58 of titanium oxide is preferably deposited upon the intermediate layer 56 under the same operating parameters utilized in depositing the inner layer 54. The outer layer 58 again preferably exhibits a high index of refraction to contribute to a high luminous transmittance of the final product. In addition, the outer layer 58 provides a relatively hard coating for the intermediate layer 56, thus protecting it from abrasion and attack which could adversely affect its electrical conductivity. As previously discussed in relation to the inner layer 54, the degree of oxidation of the titanium oxide of outer layer 58 may be ideally established in a single deposition step without the need for a subsequent oxidation step. The oxidation of outer layer 58 is controlled by monitoring deposition rate to produce a film having an optical extinction coefficient less than about 0.3. The outer layer 58 preferably has a thickness between about 200 Ångstroms and 500 Ångstroms, the specific thickness selected so as to cooperate interferometrically with the intermediate layer 56 to give high luminous transmittance. In this regard, luminous transmittance of the substrate 52 is monitored during the deposition of the outer layer 58, deposition being preferably terminated as the luminous transmittance of the article 50 increases to a peak at around 80%, due to the antireflective characteristics of the layers 54, 56, and 58. As the luminous transmittance will vary sinusoidally with continued deposition of the outer layer 58, it is preferred to terminate deposition at the first peak attained, but the present invention is not limited thereto.

The deposition of the inner layer 54, intermediate layer 56, and outer layer 58 should be accomplished at temperatures which are fully compatible with the thermal stability of the substrate 52, and which minimize the tendency of the silver or gold to agglomerate. Accordingly, temperatures in excess of about 200° C. are preferably avoided, and a usable temperature range between about 25° C. and 200° C. is preferred.

While the article 50 described above was produced with the use of a titanium metal cathode, a titanium oxide cathode which is only partially oxidized may also be utilized in the practice of the present invention. In such a case, smaller oxygen partial pressures are required to maintain the oxidation levels of the layers 54 and 58 within the desired ranges.

It will be understood from the preceding discussion that in a reactive deposition procedure in which the cathode power, deposition rate and total pressure are maintained constant, the preferred transparent electroconductive article 50 of the present invention may be produced by monitoring the luminous transmittance of the substrate 52 during each deposition step. Therefore, while it is preferred that deposition rate and total pressure be maintained constant according to the teachings hereinbefore disclosed, the present method of producing a transparent electroconductive article is not limited thereto.

For example, a coating chamber may be subjected to evacuated conditions for an extended time such that outgassing therefrom has fully stabilized or ceased. In such a system, constant argon and oxygen input rates could produce a constant deposition rate and pressure, thus resulting in a constant degree of oxidation in the titanium oxide films produced thereby. By a trial and error technique, appropriate cathode power, total pressure, and gaseous flow rates could be determined for producing the desired degree of oxidation in the titanium oxide films. After such appropriate parameters were determined and established, deposition of the inner titanium oxide layer 54 could be effected until the monitored luminous transmittance of the article 50 is between about 75% and 80% of the luminous transmittance of the uncoated substrate 52. Thereafter, the intermediate electroconductive layer 56 could be deposited until the luminous transmittance of the article 50 decreased an additional amount between 10% and 12% of the luminous transmittance of the uncoated substrate 52. The outer layer 58 would thereafter be deposited until the luminous transmittance peaked, preferably for the first time, at a value greater than 75% of the luminous transmittance of the uncoated substrate 52.

Such a control method is suited for use in a sealed production line system for the production of the transparent electroconductive article 50. Such a production line system would ideally incorporate both of the control methods herein disclosed, the former for use during start-up and quality control checks, and the latter for use during steady state operation.

Figure 5:
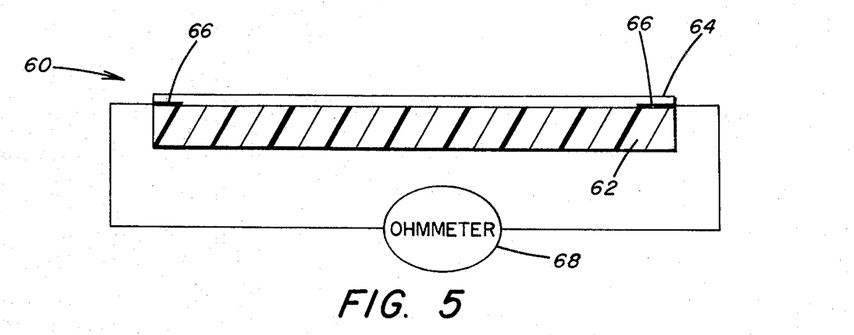
FIG. 5 is a sectional side view similar to FIG. 4 of an alternate transparent electroconductive article according to the present invention.

Referring now to FIG. 5, a second transparent, highly conductive article 60 is formed of a film 64 of indium oxide deposited upon a substrate 62 utilizing the apparatus and deposition control method of the present invention. Heretofore, indium oxide films of low resistance and high electrical stability were obtainable only by deposition onto hot substrates, or by subsequent heat treatments of the deposited film. Practice of the present invention permits the production of such indium oxide films on ambient or elevated temperature substrates without subsequent heat treatments.

A magnetron cathode 18 is faced with an indium-tin alloy containing between 10% and 20% tin. The concentration of tin in the cathode affects the final film stability and minimum resistances obtainable, 10% tin concentrations generally yielding lower resistances and less stability when used with an ambient temperature substrate 62.

A coating chamber 12 is evacuated to less than $3 \times 10^{-5}$ torr, and thereafter an evacuated atmosphere of argon and oxygen at a predetermined total pressure established therein. The magnetron cathode 18 is activated with a preselected constant power to begin sputtering overtop the activated deposition rate monitor 28. Deposition rate is then set at a predetermined value by adjustment of the oxygen input valve 36 and the total pressure is maintained constant by adjustment of the argon input valve 40.

The resistance of the indium oxide film 64 is conveniently monitored during deposition through the use of a pair of electrical connectors 66 disposed on opposite marginal edges of the surface of the substrate 62 to be coated. An ohmmeter 68 electrically connected between the electrical connectors 66 monitors the resistance therebetween, thereby measuring the resistivity of the film 64 as it is deposited. The luminous transmittance of the substrate 62 is also monitored during the deposition procedure, preferably starting at an initial value of about 90% for an uncoated clear plastic substrate.

After reaching the desired deposition conditions, the cathode 18 is scanned over the surface of the substrate 62, at a predetermined rate. A thin layer of indium oxide is deposited, the electrical resistance and luminous transmittance of which is monitored while the deposition rate is maintained constant. The electrical resistance of the film decreases with increased film thickness, while the luminous transmittance of the film decreases and increases sinusoidally due to the interferometric interaction of the film 64 and substrate 62. Deposition is preferably terminated at a point where the electrical resistance is as required and the luminous transmittance is maximized, a condition generally occurring when the film has a thickness which is a multiple of about 1350 A.

Using a cathode 18 faced with 10% tin-indium on a cold substrate, an article 60 having an electrical resistivity of about 15 ohms per square and an optical transmittance of about 80% may be produced according to the present invention. 20% tin-indium cathodes may be utilized to produce an article 60 having an electrical resistivity of about 25 ohms per square and an optical transmittance of about 80%. Lower film resistances may be attained by further increasing thickness but increased deposition time is of course required. Additionally, a resistance gradient may be established on the article 60 by scanning the cathode 18 over the surface of the substrate 62 at a controlled, non-uniform rate.

EXAMPLE I

With reference to FIGS. 1, 2, and 4, a transparent electroconductive article 50, produced according to the practice of the present invention, included a substrate 52 of glass, an inner layer 54 of titanium oxide, an intermediate layer 56 of silver, and an outer layer 58 of titanium oxide.

The chamber 12 was evacuated to less than $3 \times 10^{-5}$ torr, after which an atmosphere of about 75% argon and 25% oxygen at a total pressure of about $6 \times 10^{-4}$ torr was established. The cathode 18 was activated at a power of 25 watts/in$^2$ (3.9 watts/cm$^2$) to begin sputtering from a titanium metal target surface overtop the activated deposition rate monitor 28. The initial deposition rate was read by the deposition rate monitor 28 and thereafter adjusted to a valve of about 10.6 Å/sec by adjustment of the oxygen input rate at the oxygen input valve 36. Total pressure was maintained constant by adjustment of the argon control valve 40.

The inner layer 54 of titanium oxide was deposited upon the substrate 52 by scanning the cathode 18 thereover at a rate of 2 inches/sec (5 cm/sec.), while deposition rate, total pressure, and cathode power were maintained constant. Deposition was terminated when the luminous transmittance decreased to between 80% and 85% of the transmittance of the uncoated substrate 52, as measured by the photometer 42 and photoelectric cell 44. The inner layer 54 had an optical extinction coefficient between 0.06 and 0.08 as deposited.

The intermediate layer 56 of silver was thereafter magnetically sputtered onto the inner layer 54 from a silver target surface at a rate of 94 Å/sec at 25° C., at the same atmospheric conditions as were utilized previously. Deposition of the intermediate layer 56 was terminated when the luminous transmittance decreased an additional amount of between 10% and 12% of the transmittance of the uncoated substrate 52.

The outer layer 58 was magnetically sputtered onto the intermediate layer 56 under the same conditions used to sputter inner layer 54. Deposition was terminated when the luminous transmittance of the article 50 increased to about a peak value, preferably about 90% of the transmittance of the uncoated substrate 52. The final article 50 had an electrical resistivity of less than about 10 ohms per square.

EXAMPLE II

With reference to FIGS. 1, 2 and 5, a transparent, electroconductive article 60 was produced according to the present invention, consisting of a substrate 62 of an ambient temperature transparent substrate, having a film 64 of indium oxide deposited thereon.

A coating chamber 12 was evacuated to less than $3 \times 10^{-5}$ torr, and an evacuated atmosphere of about 75% argon and 25% oxygen at a total pressure of $6 \times 10^{-4}$ torr thereafter established. The cathode 18 was activated with a power of 6.25 watts/in$^2$ (0.97 watts/cm$^2$) to begin sputtering from a 10% tin-indium target surface overtop the activated deposition rate monitor 28. Deposition rate was set at 30 Å/sec by adjustment of the oxygen input valve 36 while total pressure was maintained constant by adjustment of the argon input valve 40.

Deposition proceeded as the cathode 18 was scanned over the substrate 62 at a rate of 2 in/sec (5 cm/sec), and was terminated when the monitored electrical resistivity decreased to 15 ohms per square and the monitored optical transmittance peaked at about 80%.

EXAMPLE III

An article 60 was produced as in Example II, except that an initial atmosphere of about 55% argon, 45% oxygen was established, cathode power was set at 14 watts/in$^2$ (2.2 watts/cm$^2$), and deposition rate was maintained at a 60 Å/sec. An article 60 having an electrical resistivity of 15 ohms per square and 80% luminous transmittance resulted.

A comparison of Examples II and III illustrates that the present invention may be practiced over a wide range of cathode power settings and deposition rates. Accordingly, the foregoing examples are offered to illustrate the present invention, but are not intended to be limiting thereto, the scope of the present invention being defined by the claims which follow.

I claim:

1. A method for controlling the reactive sputtering of an oxide-containing film, comprising the steps of:

establishing an atmosphere having a gas pressure less than about $10^{-1}$ torr within a coating chamber, said atmosphere comprised of a partial pressure of oxygen and a partial pressure of a chemically inert gas;

sputtering a selected material from a cathode toward a substrate at a constant predetermined electrical power;

monitoring the deposition rate of a film of an oxide of said selected material being formed on said substrate thereby to indicate oxygen partial pressure in the chamber;

monitoring the total gas pressure within said coating chamber; and inputting at least oxygen or said chemically inert gas into the chamber in response to said monitored deposition rate and total gas pressure thereby to maintain a constant deposition rate at a constant total gas pressure.

2. The method as set forth in claim 1 wherein said inputting step includes the steps of:
increasing the oxygen input rate in response to increases in said monitored deposition rate; and
decreasing the input rate of said chemically inert gas in response to increases in said monitored total gas pressure.

3. The method as set forth in claim 2 further comprising the steps of:
scanning said cathode spaced from and over the surface of said substrate during said sputtering step; and
practicing said deposition rate monitoring step at least intermittently during said scanning step.

4. The method as set forth in claim 3 wherein said monitoring steps and said inputting step are continuously practiced during said scanning step.

5. The method as set forth in claim 1, 3 or 4 wherein said deposition rate monitoring step is performed by monitoring the frequency of vibration of an activated quartz crystal which is subjected to said deposition.

6. The method as set forth in claim 2 wherein said sputtering step comprises magnetically enhanced reactive sputtering.

7. The method as set forth in claim 6 wherein said selected material is titanium, and wherein said film comprises titanium oxide having less than two parts oxygen to one part titanium.

8. The method as set forth in claim 7 wherein said film comprises titanium oxide having greater than 1.7 parts of oxygen to one part titanium.

9. The method as set forth in claim 6 or 8 wherein said film comprises titanium oxide having an optical extinction coefficient between about 0.03 and 0.3.

10. The method as set forth in claim 9 wherein said total gas pressure is between about $5 \times 10^{-4}$ torr and about $7 \times 10^{-4}$ torr, wherein said constant deposition rate is about 10.6 Å/sec and wherein said predetermined electrical power is about 25 watts/in$^2$ (3.9 watts/cm$^2$).

11. The method as set forth in claim 6 wherein said selected material is an indium-tin alloy containing between about 10% and 20% tin, wherein said atmosphere is comprised of about 25% oxygen and about 75% argon, wherein said total gas pressure is about $6 \times 10^{-4}$ torr, and wherein said predetermined electrical power is about 6.25 watts/in$^2$ (1 watt/cm), and wherein said constant deposition rate is about 30 Å/sec.

12. The method as set forth in claim 6 wherein said selected material is an indium-tin alloy containing between about 10% and 20% tin, wherein said atmosphere is comprised of about 45% oxygen and about 55% argon, wherein said total gas pressure is about $6 \times 10^{-4}$ torr, wherein said predetermined electrical power is about 14 watts/in$^2$ (2.2 watts/cm$^2$), and wherein said constant deposition rate is about 60 Å/sec.

13. Apparatus for reactively sputtering an oxide-containing film onto a substrate, comprising:
a coating chamer;
means for evacuating said chamber;
a cathode;
means for mounting said substrate within said chamber;
means for mounting said cathode within said chamber facing and spaced from said substrate;
means for applying a constant electrical power to said cathode to sputter an oxide-forming material therefrom;
means responsive to the sputtering of said oxide-forming material for monitoring the rate of deposition of said oxide-containing film on said substrate;
means for monitoring total gas pressure in said chamber;
means responsive to said deposition rate monitoring means for inputting oxygen into said chamber; and
means responsive to said gas pressure monitoring means for inputting a chemically inert gas into said chamber to maintain said total pressure constant.

14. The apparatus as set forth in claim 13 further comprising:
means for monitoring the luminous transmittance of said substrate while said oxide-containing film is being deposited.

15. The apparatus as set forth in claim 13 or 14 wherein said deposition rate monitoring means comprises an activated quartz crystal.

16. The apparatus as set forth in claim 15 wherein said mounting means includes means for scanning said cathode in spaced relation to said substrate and further comprising:
means for mounting said activated crystal monitor to said cathode to monitor said deposition rate continuously while said cathode scans.

* * * * *

UNITED STATES PATENT AND TRADEMARK OFFICE
CERTIFICATE OF CORRECTION

PATENT NO. : 4,336,119
DATED : June 22, 1982
INVENTOR(S) : F. Howard Gillery

It is certified that error appears in the above-identified patent and that said Letters Patent are hereby corrected as shown below:

On the title page

In the References Cited, U.S. Patent Documents, insert

--4,201,649  5/1980  Gillery  204/192 P--.

Column 13, line 21, "Claim" should be --Claims--.

Signed and Sealed this

Twelfth Day of October 1982

[SEAL]

Attest:

GERALD J. MOSSINGHOFF

Attesting Officer

Commissioner of Patents and Trademarks